United States Patent [19]
Sridhar et al.

[11] Patent Number: 5,930,595
[45] Date of Patent: Jul. 27, 1999

[54] ISOLATION PROCESS FOR SURFACE MICROMACHINED SENSORS AND ACTUATORS

[75] Inventors: Uppili Sridhar; Liu Lian Jun; Foo Pang Dow; Lo Yong Hong; Maio Yu Bo, all of Singapore, Singapore

[73] Assignee: Institute of Microelectronics National University of Singapore, Singapore, Singapore

[21] Appl. No.: 08/950,776

[22] Filed: Oct. 15, 1997

[51] Int. Cl.⁶ ..................................................... H01L 21/62
[52] U.S. Cl. .............................. 438/52; 438/48; 257/414; 257/415
[58] Field of Search ......................... 438/48, 52; 257/414, 257/415, 431, 369

[56] References Cited

U.S. PATENT DOCUMENTS

| | | |
|---|---|---|
| 5,068,203 | 11/1991 | Logsdon et al. . |
| 5,313,835 | 5/1994 | Dunn . |
| 5,324,683 | 6/1994 | Fitch et al. . |
| 5,411,919 | 5/1995 | Inada . |
| 5,510,645 | 4/1996 | Fitch et al. . |
| 5,659,195 | 8/1997 | Kaiser et al. . |
| 5,719,069 | 2/1998 | Sparks . |

FOREIGN PATENT DOCUMENTS

| | | |
|---|---|---|
| 702221 | 3/1996 | European Pat. Off. . |
| 6-112509 | 4/1994 | Japan . |
| 6-350105 | 12/1994 | Japan . |
| 9-113534 | 5/1997 | Japan . |
| 9-318649 | 12/1997 | Japan . |

*Primary Examiner*—Charles Bowers
*Assistant Examiner*—Martin Sulsky
*Attorney, Agent, or Firm*—Proskauer Rose LLP

[57] ABSTRACT

A novel process for fabricating an integrated circuit sensor/actuator is described. Silicon islands are created by forming deep trenches in a substrate and lining the trenches with oxide. This forms silicon islands substantially surrounded by electrically isolating oxide. The anchor portion of the sensor/actuator beams is connected to the islands and is released from the substrate and therefore is also electrically isolated from the substrate. The IC sensor/actuator is manufactured by forming deep trenches in a substrate. These trenches preferably surrounding substrate material on three sides and the bottom, thus creating "islands" of substrate material surrounded by trenches and leaving one side of the island uncovered by the trench; lining the trenches with electrically insulating material, such as an oxide, thus surrounding the substrate material island with an electrical insulator; forming sensor/actuator beams in the substrate material such that the beams contact the uncovered portion of the islands; and using release etching, isolating the sensor/actuator beams from the substrate. The island/beam structure may be connected to a CMOS or other IC structure using conventional metalization processes.

10 Claims, 6 Drawing Sheets

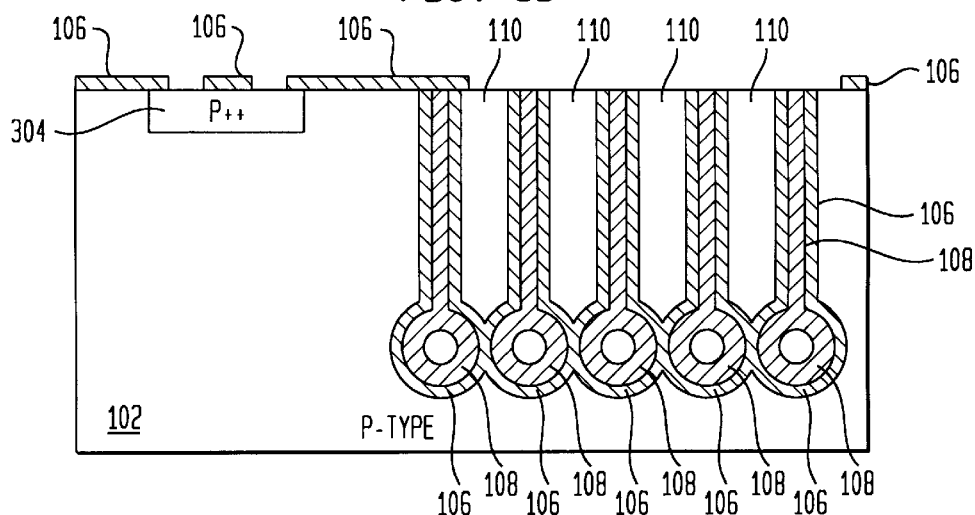
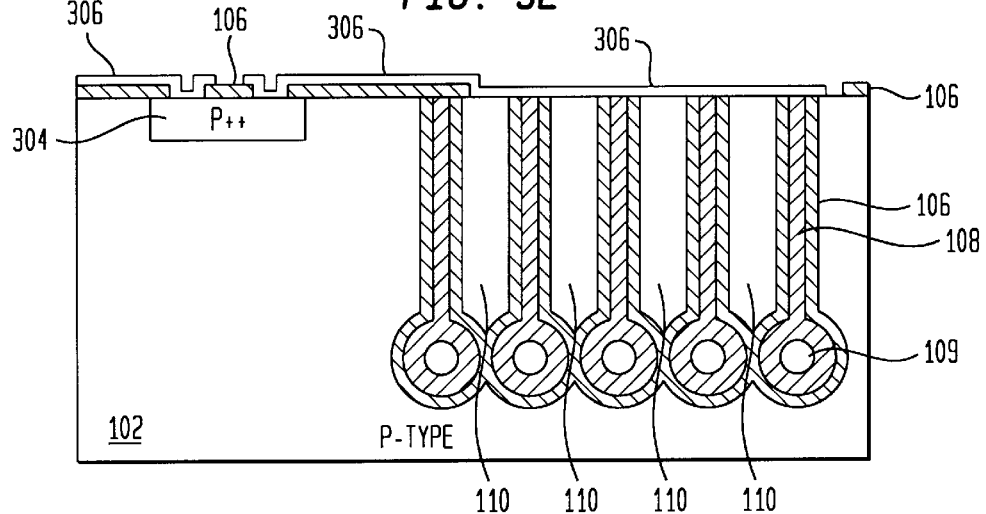
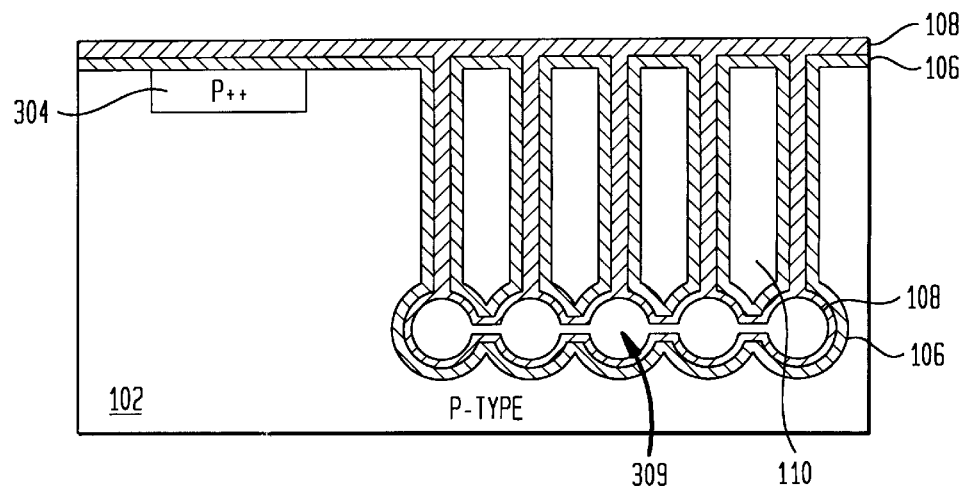

ISOLATION PROCESS FOR SURFACE MICROMACHINED SENSORS AND ACTUATORS

BACKGROUND OF THE INVENTION

1. Field of the Invention

The present invention relates to a process for fabricating integrated circuit (IC) sensors and/or actuators and, more particularly, to a process for fabricating electrically isolated silicon "islands" which interface with silicon "beams". The islands and beams are constructed in a manner which completely electrically isolates the islands and beams from the IC substrate, has a low parasitic capacitance, and may be compatible with a complementary metal oxide semiconductor (CMOS) process.

2. Discussion of Related Art

Currently, integrated circuit (IC) sensors and actuators, such as accelerometers, pressure sensors, and gyroscopes are manufactured using either a bulk micromachining process or a surface micromachining process. "Bulk" micromachining refers to structures formed by deep anisotropic etching. "Surface" micromachining refers to structures formed from thin film layers deposited or grown on the surface of a substrate. Surface micromachining has advantages over the previous bulk micromachining process of fabricating IC sensors and actuators because it permits smaller devices and may by integrated with other circuits on an IC.

Surface micromachining typically involves etching in a silicon substrate deep trenches between 10 microns and 100 microns deep. The resulting silicon structures (called "beams") are partially released (i.e., detached) from the silicon substrate by known processes such as wet or dry etching. This deep trench technology is described, for example, in Klaassen, et al. "Fusion Bonding and Deep Reactive Ion Etching: A New Technology for Microstructures," Transducers '95, Stockholm, Sweden, 1995. The contents of this article are incorporated herein by reference.

FIG. 1 is a top view of a typical micromachined sensor or actuator structure 50. (FIG. 1 shows four thermal actuators). The sensor/actuator 50 includes a substrate 52 from which a number of beams 54 are cantilevered via deep trenches 56 formed in the substrate 52. The beams 54 are connected to the substrate 52 at anchor portions 58.

One problem associated with the beams is electrically isolating them from the substrate. Several known techniques are used to address this problem. A first technique for electrically isolating sensor/actuator beams from an IC substrate is to cover the beams with an electrical insulator such as a silicon dioxide film. A thin film of aluminum (Al) or other suitable metal is then deposited on the insulator. The metal operates as an electrically conductive portion of the device and the beams, which are electrically isolated by the surrounding silicon dioxide film, act only as a mechanical structure. One drawback of this technique is that the metalization causes metal particles to "creep", thus the sensor or actuator is vulnerable to degraded performance due to time and temperature. This structure is also subject to a high parasitic capacitance to the IC substrate.

A second technique for electrically isolating sensor/actuator beams from an IC substrate is to isolate the beams from the substrate by leaving a cavity beneath the beams using a silicon bonding technique, as described in the Klaassen, et al. article referred to above. The beam anchors (where one end of beams are connected to the substrate) are electrically isolated from the substrate with an intermediate oxide layer grown during silicon wafer bonding.

A third technique for electrically isolating sensor/actuator beams from an IC substrate is to use impurity diffusion to isolate the beams. This technique is prone to parasitic capacitance and leakage current.

A fourth technique for electrically isolating sensor/actuator beams from an IC substrate is to fusion bond the beams to a layer of electrically isolating oxide which separates the beams from the substrate. Although this provides effective electrical isolation, it is difficult to provide planar surfaces for further processing. This is because the beams extend above the IC substrate by tens of microns. Running metalization to connect them to the IC may be difficult due to the "steps" in the surface. The beams are surrounded by trenches and diffusion isolation for planar leadouts may cause electrical leakage and high parasitic capacitance at the trench/diffused junction interface.

Therefore, it is an object of the present invention to provide a process for manufacturing IC sensors and/or actuators that completely electrically isolates the sensor's beams from the substrate.

It is another object of the present invention to provide a process for manufacturing IC sensors and/or actuators that has low parasitic capacitance.

It is yet another object of the present invention to provide a process for manufacturing IC sensors and/or actuators that is compatible with CMOS processes.

SUMMARY OF THE INVENTION

These and other objects of the present invention are provided by a novel process for fabricating integrated circuit sensor/actuators. In a preferred embodiment of the present invention, silicon islands are formed in the substrate. These islands are preferably created by forming deep trenches in the substrate and lining the trenches with oxide. This forms silicon islands substantially surrounded by electrically insulating oxide. The anchor portion of the sensor/actuator beams is connected to the islands and is released from the substrate and therefore the entire beam—including the anchor portion—is also electrically isolated from the substrate.

In a preferred embodiment, the IC sensor/actuator is manufactured according to the following process:

1. forming deep trenches in a substrate, these trenches preferably surround substrate material on three sides and bottom, thus creating "islands" of substrate material surrounded by trenches, and leaving one side of the island uncovered by the trenches, so that, e.g., three sides and the bottom of the substrate may be severed from the substrate;
2. lining the trenches with electrically insulating material, such as an oxide, thus surrounding the substrate material island with an electrical insulator, so that typical planar processes, such as opening contact regions and etching metal interconnects, can be subsequently performed without damage;
3. forming sensor/actuator beams in the substrate material such that the beams contact the uncovered portion of the islands;
4. using release etching, isolating the sensor/actuator beams from the substrate.

In a preferred embodiment, the island/beam structure may be connected to a CMOS or other IC structure using conventional metalization processes.

BRIEF DESCRIPTION OF THE DRAWINGS

The present invention is described with reference to the following figures:

FIGS. 3A–3F are cross-sectional views of the interface of FIG. 2 along line 2B—2B illustrating a preferred process for forming the substrate material islands;

DETAILED DESCRIPTION OF PREFERRED EMBODIMENTS

Figure 2A:
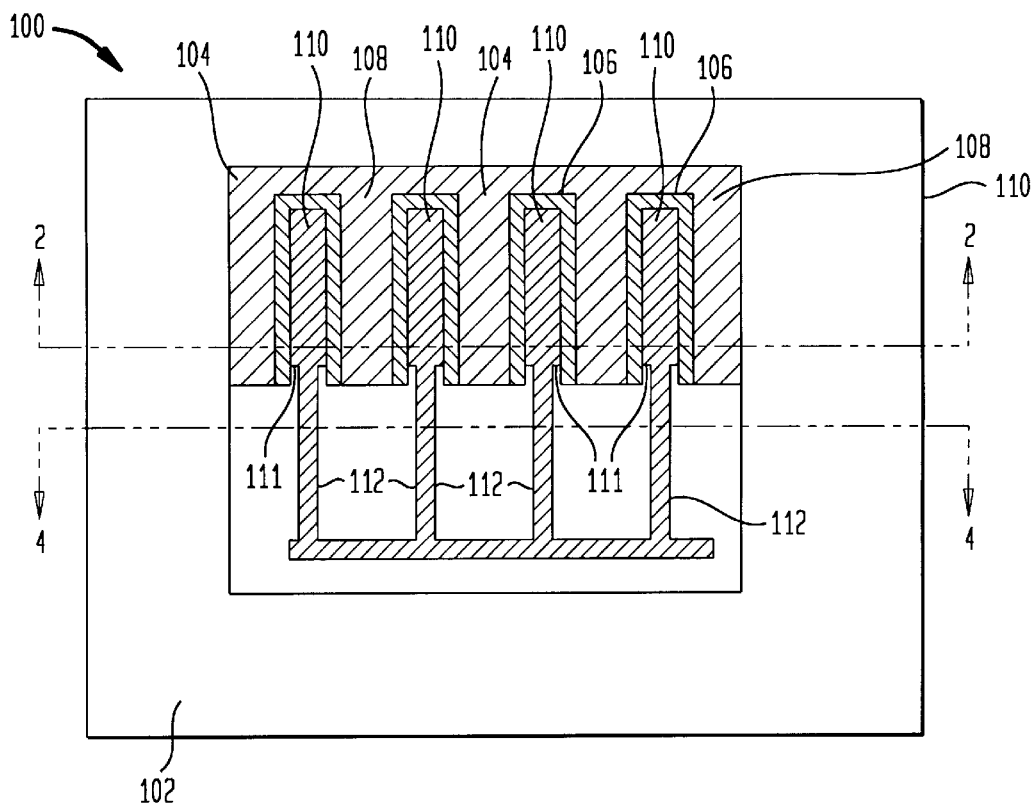
FIG. 2A is a top plan view of an interface between substrate material "islands" and sensor/actuator beams according to a preferred embodiment of the present invention.
Figure 2B:
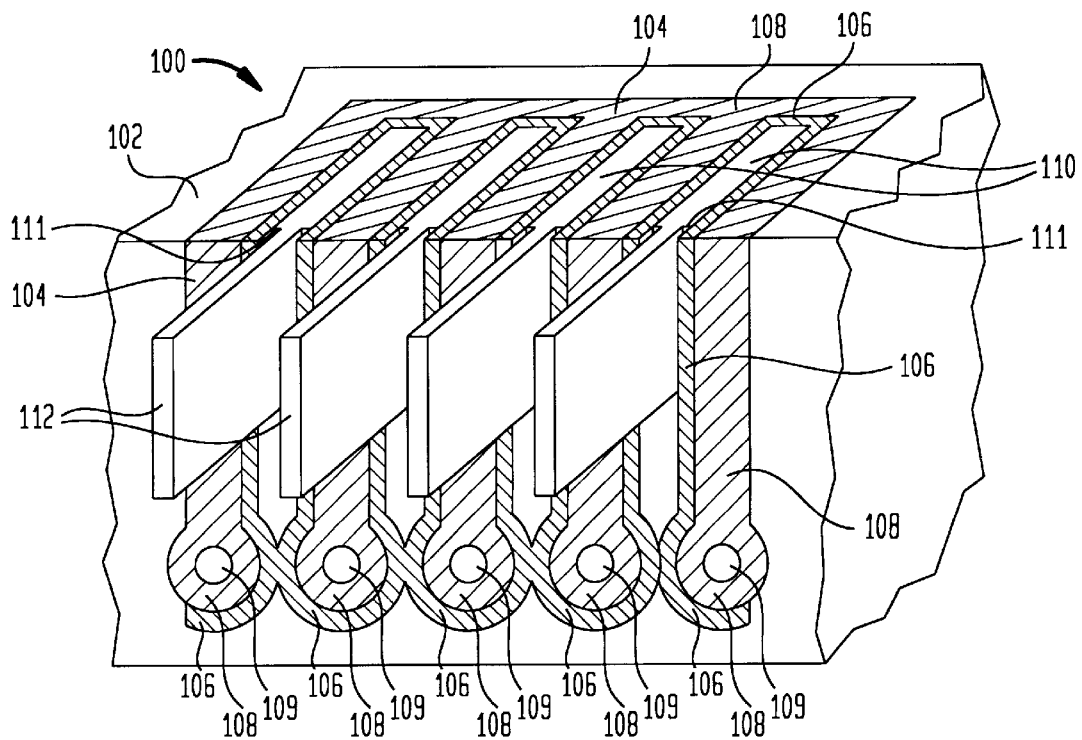
FIG. 2B is a cross-sectional isometric view of the interface of FIG. 2A taken along line 2B—2B.

FIGS. 2A and 2B illustrate a preferred interface 100 between substrate material "islands" and sensor or actuator beams (hereinafter occasionally referred to collectively as sensor beams) according to the present invention. FIG. 2A is a top view and FIG. 2B is a cross-sectional isometric view taken along line 2B—2B of FIG. 2A. This preferred embodiment includes a substrate material 102, such as silicon, in which a number of trenches 104 are formed. The trenches 104 are preferably U-shaped and lined on all sides and on the bottom with a layer of thermal oxide 106 and filled with a trench filling oxide 108, such as a low pressure chemical vapor deposition of TEOS (tetraethylorthosilicate) or BPSG (borophosphosilicate). (An unfilled tubular volume 109 may be defined towards the bottom of the trench.) An area of substrate material 110 is enclosed within each trench 104. These areas 110 are referred to herein as "islands". These islands 110 are surrounded on three sides and on the bottom by the thermal oxide 106 and trench fill oxide 108 defined in the trenches 104. Thus, the islands are electrically isolated from the substrate 102 on these sides. In other word, three sides and the bottom of the islands are completely severed from the substrate.

One side 111 of the islands is not covered by the insulating oxides 106, 108 of the trenches. The sensor beams 112 connect to the islands at this uncovered side 111. This connection is the anchor portion of the beam, such as described with reference to FIG. 1.

A preferred process for forming the islands 110 to which the beams 112 are connected is described with reference to FIGS. 3A–3E. A preferred process for forming the beams 112 is described with reference to FIGS. 4A–4C. A preferred metalization of a sensor/actuator according to the present invention is described with reference to FIGS. 5A and 5B.

Forming The Substrate Material Islands

Figure 3A:
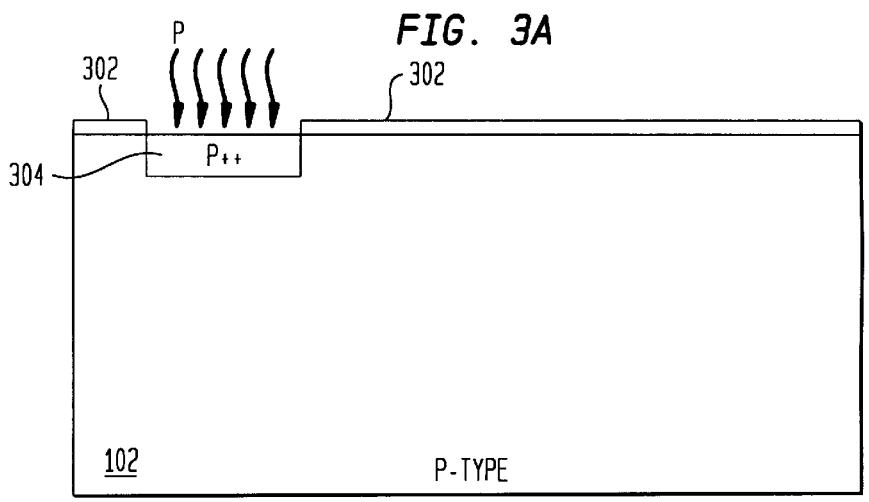

A preferred process for forming the substrate material islands 110 is described with reference to FIGS. 3A–3F, which are cross-sectional views of the interface 100 along line 2B—2B. In FIG. 3A, a p-type silicon wafer substrate 102 is covered with photoresist 302. (Although FIG. 3A shows a p-type silicon substrate 102, a person skilled in the art readily understands that an n-type substrate could also be used.) The photoresist is removed from selected areas and the exposed portion of the substrate is heavily doped with boron at a dopant concentration of $10^{18}$–$10^{19}$ cm$^{-3}$ to create a p++region. The p++region may be used to reduce series resistance. Preferably, if the sensor/actuator being fabricated is being used with CMOS devices on the same substrate, the doping may occur at the same time as the source and drain formation during the CMOS fabrication process. After the doping process, the photoresist is removed.

Figure 1:
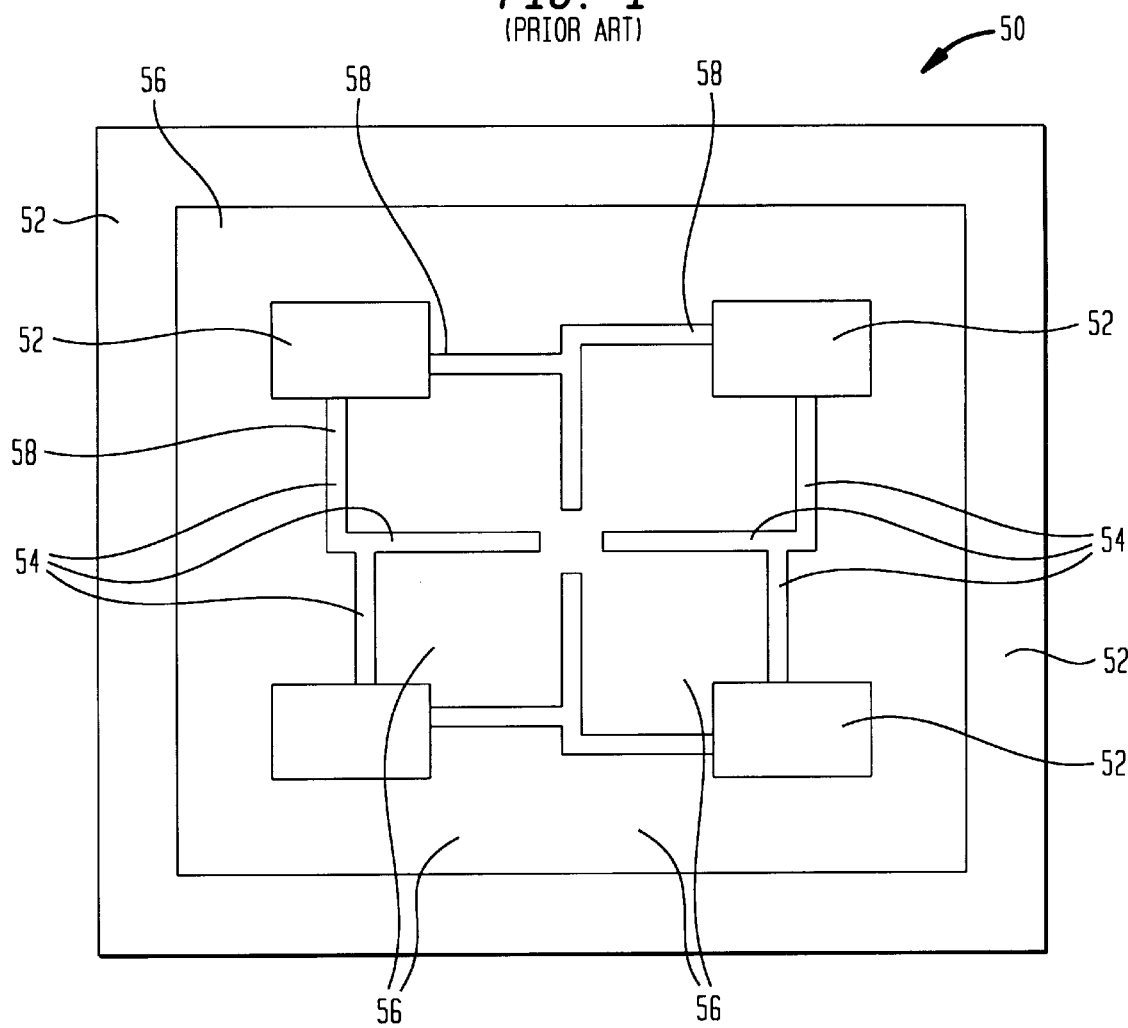
FIG. 1 is a top view of a conventional IC sensor/actuator.

The substrate 102 is then patterned using any suitable patterning method and etched using deep trench etching technology to form deep trenches 104. The manner in which the deep trenches are formed is conventional. The trenches 104 are preferably U-shaped, as seen in FIG. 1. The bottom of the trench 104 is preferably undercut in the following manner. A protective layer, such as silicon dioxide, lines the trench walls. An anisotropic etching process using wet silicon etchants such as tetra methyl ammonium hydroxide is performed to form a tubular undercut 306 of silicon at the bottom of the trench. The trench is preferably about 1 to 3 microns wide and 15 microns deep. The result of these processes is seen in FIG. 3B.

Next, all protective layers are stripped from the top and sidewalls of the trench using a silicon dioxide etchant such as HF. Then, thermal oxidation is performed. This results in a thermal oxide layer 106 preferably between 0.5 and 1 micron wide. The thermal oxide layer 106 lines the inner walls of the trenches and the top of the substrate 102. This thermal oxide layer 106 completely surrounds the silicon islands 110 on three sides and the bottom. The trench is then filled with trench filling oxide 108, such as TEOS (tetraethylorthosilicate) or BPSG (borophosphosilicate) applied using, for example, low pressure chemical vapor deposition (LPCVD). Part of the tubular portions 306 of the trenches 104 may remain unfilled by the trench filling oxide 108 to define an unfilled tubular volume 109 in the trench 104. The result of these steps is seen in FIG. 3C.

The trench filling oxide 108 on top of the substrate (if any) is removed and the thermal oxide 106 on the top of the substrate is patterned and etched using, for example, wet etching, preferably leaving a layer of several thousand Angstroms (i.e., 2000 Angstroms). Alternatively, all of the thermal oxide may be etched off using, for example, a wet or dry etching or a chemical mechanical polish. The result of these steps is seen in FIG. 3D.

Figure 3B:
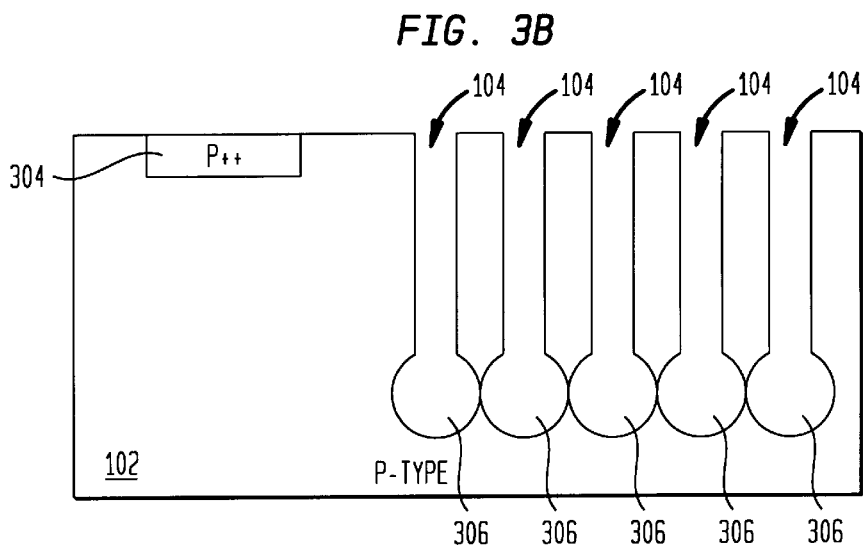
Figure 3C:
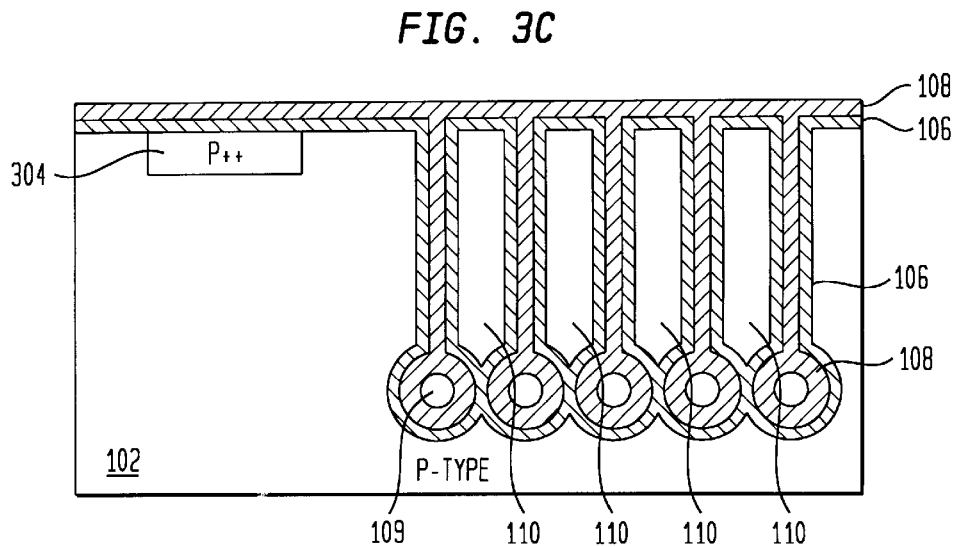

In addition, to further enhance isolation on the bottom of the islands, a wet or dry etchant may be used to open a contiguous hole, through the tubular undercuts 306 of FIG. 3B to form a contiguous hole 309. Thereafter, the trenches are filled with thermal oxide layer 106 and trench filling oxide 108, as described with reference to FIG. 3C. This enhanced embodiment is shown in FIG. 3F. Once the thermal and trench filling oxides are formed, the islands are held rigidly in place, despite hole 309. The advantages of the relatively large hole 309 stem from the inherent isolation properties of air contained in hole 309.

At this point in the fabrication process, CMOS circuitry may be fabricated on other areas of the substrate using any suitable CMOS fabrication method. After the CMOS fabrication process, the sensor/actuator beams may be formed. A metalization layer, preferably about 6000 Angstroms thick, is deposited over desired portions of the structure using, for example, sputter deposition. The result of this step is seen in FIG. 3E (shown with unfilled tubular volumes 109, although contiguous hole 309 may also be implemented, as described above). The completed silicon islands 110 are electrically isolated from the substrate material 102.

Forming the Sensor/Actuator Beams

Figure 4A:
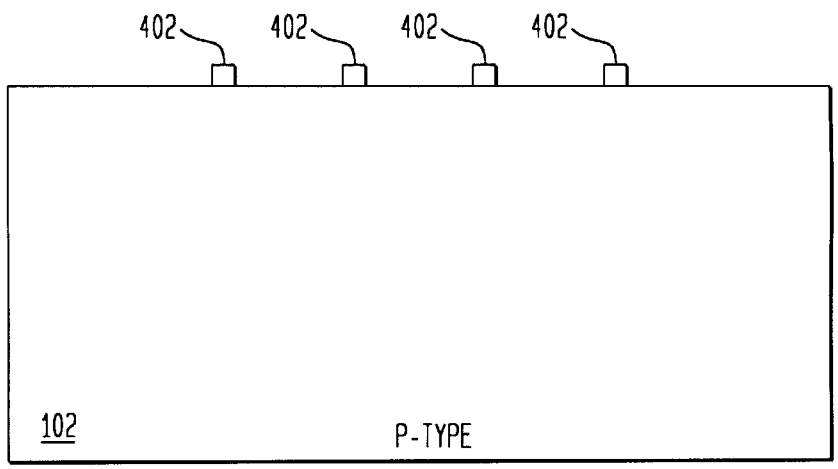
FIGS. 4A–4C are cross-sectional views of the interface of FIG. 2A taken along line 4—4 illustrating a preferred process for forming the sensor/actuator beams.
Figure 4B:
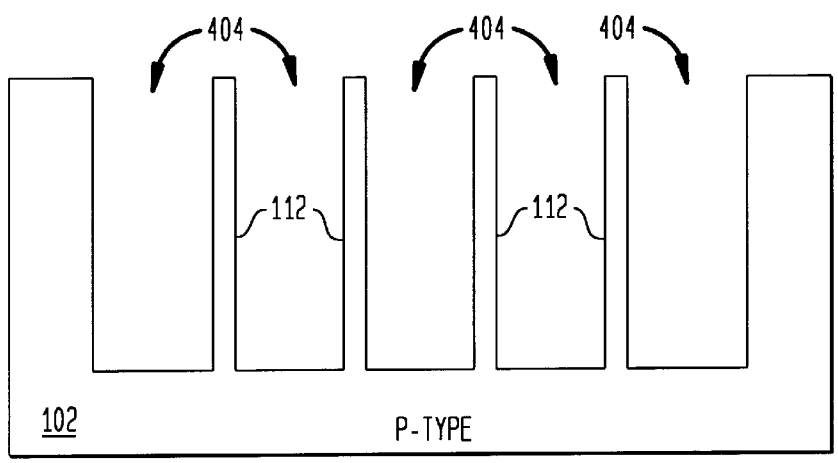

A preferred process for forming the sensor/actuator beams 112 is described with reference to FIGS. 4A–4C, which are cross-sectional views of the interface 100 of FIG. 2A taken along line 4—4. FIG. 4A shows photoresist 402 or other mask on the substrate surface. As seen in FIG. 4B, using deep trench etching technology, deep trenches 404 are formed in the substrate 102 to define a number of silicon beams 112. These silicon beams 112 are connected to the silicon islands 110 at the uncovered side 111 of the islands.

Figure 4C:
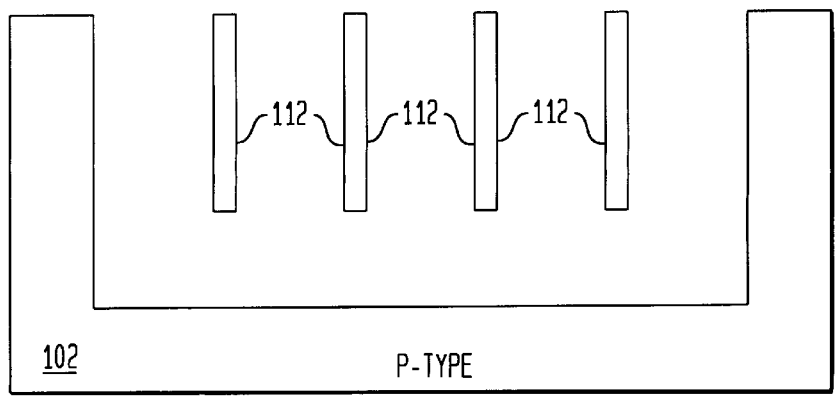

As seen in FIG. 4C, the sensor beams 112 are completely released from the substrate using release etching techniques, such as those described in Shaw, et al., "A Single Mask Lateral Accelerometer", 7th Annual Conference on Solid-State Sensors and Actuators. The contents of this article are incorporated herein by reference. Because the sensor beams 112 do not contact the substrate 102, the beams 112 are electrically isolated from the substrate 102.

Metalization

Figure 5A:
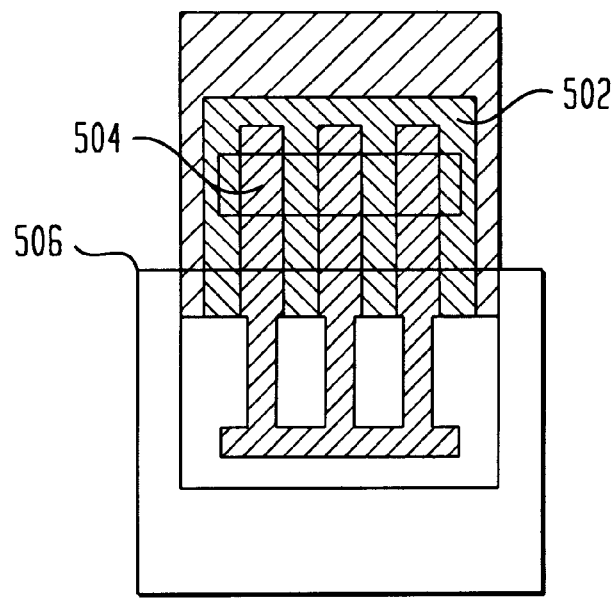
FIGS. 5A and 5B are top plan views illustrating metalization of an interface according to a preferred embodiment of the present invention.
Figure 5B:
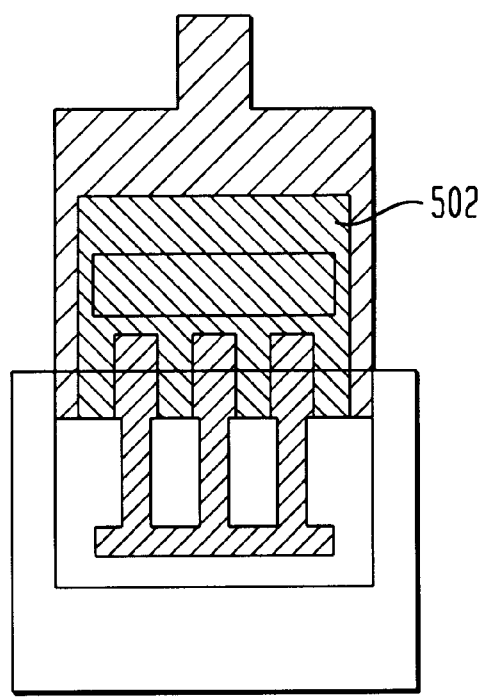

FIGS. 5A and 5B illustrate preferred metalization patterns for a sensor/actuator according to the present invention. FIGS. 5A and 5B are top views and show areas where a metalization layer 502 (preferably aluminum) is located on the substrate in order to contact the silicon islands 110, which are electrically connected to the beams 112. FIG. 5A also shows where a contact cut out and a via cut out are located.

Preferably, the metalization steps described above are performed prior to the sensor/actuator beam forming process. Thus, the beam forming process is the final process in which lithographic patterning may be needed.

In conclusion, a process for forming an IC sensor/actuator having complete electrical isolation for the substrate and a low parasitic capacitance is described. The process is compatible with CMOS processes and thus may be conveniently fabricated with CMOS devices. The above described embodiments of the invention are intended to be illustrative only. Numerous alternative embodiments may be devised by those skilled in the art without departing from the spirit and scope of the following claims.

We claim:

1. A method for connecting beams of an integrated circuit sensor or actuator to a substrate, the method comprising the steps of:
    a. forming trenches in a substrate, the trenches substantially surrounding islands of substrate material and leaving one side of the island uncovered by the trench;
    b. lining the trenches with electrically insulating material; and
    c. forming sensor beams in the substrate material such that the beams contact the open portion of the islands and are released from the substrate.

2. The method of claim 1, wherein the step of forming the sensor beams further includes using release etching to release the beams from the substrate.

3. The method of claim 1, wherein the step of forming the trenches further comprises the steps of:
    a. etching deep trenches in the substrate;
    b. undercutting the trenches; and
    c. performing thermal oxidation on the undercut trenches to form an oxide layer on the walls and bottom of the trench.

4. The method of claim 3, wherein the step of undercutting comprises the steps of:
    a. lining walls of the trenches with a protective layer; and
    b. performing an anisotropic etch on the trenches.

5. The method of claim 1, wherein the step of forming the sensor beam further comprises the steps of:
    a. forming deep trenches in the substrate, the deep trenches defining sensor beams contacting the open portion of the islands; and
    b. using release etching to release the beams from the substrate.

6. The method of claim 1, further comprising forming a heavily doped region in the substrate prior to the step of forming the trenches.

7. The method of claim 6, wherein the step of forming the heavily doped region occurs during formation of a source region and a drain region of a CMOS device on the substrate.

8. The method of claim 1, wherein the integrated sensor or actuator is integrated on the substrate with a CMOS device.

9. The method of claim 1, wherein the step of forming the trenches further comprises the steps of:
    a. forming a tubular undercut at the bottom of said trenches; and
    b. forming a hole between each said tubular undercut to form an air gap under said trenches, said air gap acting as an insulator.

10. A method for connecting beams of an integrated circuit sensor or actuator to a substrate, the method comprising the steps of:
    a. forming trenches, having four sides, a top and a bottom, in a substrate, the trenches substantially surrounding islands of substrate material on three of said sides and on said bottom, thereby leaving one side of the island uncovered by the trench;
    b. lining the trenches with electrically insulating material; and
    c. forming sensor beams in the substrate material such that the beams contact the open portion of the islands and are released from the substrate.

* * * * *

UNITED STATES PATENT AND TRADEMARK OFFICE
CERTIFICATE OF CORRECTION

PATENT NO. : 5,930,595
DATED : July 27, 1999
INVENTOR(S) : Uppili Sridhar, et al.

It is certified that error appears in the above-identified patent and that said Letters Patent is hereby corrected as shown below:

The title page, item 75, the fifth inventor's name should read:
--Miao Yu Bo--.

The title page, item 75, the fourth inventor's name should read:
--Loh Yong Hong--;

The title page, item 73, the Assignee's name should read:
--Institute of Microelectronics--.

Signed and Sealed this

Fifth Day of September, 2000

Attest:

Q. TODD DICKINSON

Attesting Officer

Director of Patents and Trademarks